US009507331B2

(12) United States Patent
Jones et al.

(10) Patent No.: US 9,507,331 B2
(45) Date of Patent: Nov. 29, 2016

(54) REMOTE CONTROL OF SHAKING MACHINE FOR A SIGNAL ACQUISITION DEVICE

(71) Applicant: AT&T Intellectual Property I, L.P., Atlanta, GA (US)

(72) Inventors: Todd W. Jones, Kansas City, MO (US); Jason Gabriel Hill, Belton, MO (US); Gary Alan Thompson, Paola, KS (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 183 days.

(21) Appl. No.: 14/274,081

(22) Filed: May 9, 2014

(65) Prior Publication Data

US 2015/0325904 A1 Nov. 12, 2015

(51) Int. Cl.
*H01Q 1/02* (2006.01)
*G05B 15/02* (2006.01)
*H03K 17/78* (2006.01)

(52) U.S. Cl.
CPC .............. *G05B 15/02* (2013.01); *H01Q 1/02* (2013.01); *H03K 17/78* (2013.01); *G05B 2219/2642* (2013.01)

(58) Field of Classification Search
CPC ........ H01Q 1/02; G05B 15/02; H03K 17/78; G05K 15/02
USPC ........................................................ 343/704
See application file for complete search history.

(56) References Cited

U.S. PATENT DOCUMENTS

| 2,105,925 A | 1/1938 | Merriam |
| 2,679,003 A | 5/1954 | Edwin |
| 2,679,004 A | 5/1954 | Edwin |
| 3,042,918 A | 7/1962 | Casey |
| 3,779,488 A | 12/1973 | Levin |
| 4,009,420 A * | 2/1977 | Martinez-dePison ... G05F 1/577 361/88 |
| 4,732,351 A | 3/1988 | Bird |
| 5,010,350 A | 4/1991 | Lipkin et al. |
| 5,474,261 A | 12/1995 | Stolarczyk et al. |

(Continued)

FOREIGN PATENT DOCUMENTS

| JP | S63187704 A | 8/1988 |
| JP | h11211821 A | 8/1999 |
| JP | 2003258516 A | 9/2003 |

OTHER PUBLICATIONS

ETI® "Broadcast Transmitting Antenna Ice Detectors MODEL CIT™-XTV," Part No. 17797, Installation and Operation Manual, Environmental Technology, Inc., 18035 12/07, networketi.com/wp/wp-content/uploads/man-citxtv_18035.pdf.

(Continued)

*Primary Examiner* — Hoang V Nguyen
(74) *Attorney, Agent, or Firm* — Jackson Walker L.L.P.

(57) ABSTRACT

A multimedia delivery platform includes a platform manager configured to monitor status of platform resources including content acquisition resources and a managed element, visible to the platform manager, including an externally accessible contact closure. A state of the contact closure is specified by user input provided by a platform manager user. The platform includes a shaking device configured to shake a signal acquisition device such as a dish antenna. A power relay in the platform includes a control terminal coupled to the contact closure of the managed element and output terminals configured to deliver power to the shaking machine upon activation of the power relay.

20 Claims, 4 Drawing Sheets

(56) References Cited

U.S. PATENT DOCUMENTS

| | | | |
|---|---|---|---|
| 5,945,955 A | 8/1999 | Glover et al. | |
| 6,018,152 A | 1/2000 | Allaire et al. | |
| 6,172,647 B1 * | 1/2001 | Jones | E04D 13/103 |
| | | | 219/213 |
| 6,218,647 B1 | 4/2001 | Jones | |
| 6,326,930 B1 | 12/2001 | Jones | |
| 6,426,887 B2 * | 7/2002 | Nagai | H02J 9/005 |
| | | | 363/78 |
| 6,445,349 B1 | 9/2002 | Jones | |
| 6,518,497 B1 | 2/2003 | Allaire et al. | |
| 6,630,901 B1 | 10/2003 | Winter et al. | |
| 6,653,598 B2 | 11/2003 | Petrenko et al. | |
| 7,068,233 B2 | 6/2006 | Thornberg et al. | |
| 7,629,558 B2 | 12/2009 | Petrenko | |
| 7,902,854 B2 | 3/2011 | Gunn et al. | |
| 8,207,900 B1 | 6/2012 | Apgar | |
| 8,305,277 B2 | 11/2012 | Reams | |
| 8,659,490 B2 * | 2/2014 | Walton | H01Q 1/02 |
| | | | 343/704 |
| 2011/0240621 A1 | 10/2011 | Kessler et al. | |
| 2013/0234779 A1 * | 9/2013 | Klug, Jr. | H03K 17/04123 |
| | | | 327/432 |

OTHER PUBLICATIONS

Andrew, "Earth Station Antenna Products and Systems.", www.satcom-service.ru/files/catalog/doc/ANDREW/390-429.PDF.

Shively, "FM Broadcast Antenna De-Icer System Model 94068," Shively Labs®, Instruction Manual: Installation, Operation & Maintenance. www.shively.com/im94068.pdf.

Laforte et al., "State-of-the-art on power line de-icing," Atmospheric Research, 1988—Elsevier, Atmospheric Research, vol. 46, Issues 1-2, Apr. 1998, pp. 143-158. http://dx.doi.org/10.1016/S0169-8095(97)00057-4.

W.B. Walton Enterprises "Year in Review," SatMagazine by Satnews. http://www.satmagazine.com/story.php?number=855419911.

* cited by examiner

REMOTE CONTROL OF SHAKING MACHINE FOR A SIGNAL ACQUISITION DEVICE

BACKGROUND

Field of the Disclosure

The following specification discloses inventions in the field of multimedia content delivery platforms and, more specifically, methods and systems for maintaining the delivery platform's environmentally exposed multimedia signal acquisition devices.

Description of the Related Art

In the field of multimedia content delivery, outdoor signal acquisition devices exposed to environmental conditions may experience reliability challenges related to extreme weather including extreme winter weather in central and northern North America, Europe, Asia, and elsewhere. Accumulation of snow on a dish antenna, for example, can result in loss of signal. Conventional methods and systems for preventing weather conditions from impacting the reliability of environmentally exposed signal acquisition devices may lack sufficient ability to identify weather conditions warranting corrective action and may reside beyond the scope of the platform's management system.

DESCRIPTION OF THE EXEMPLARY EMBODIMENTS

Figure 1:
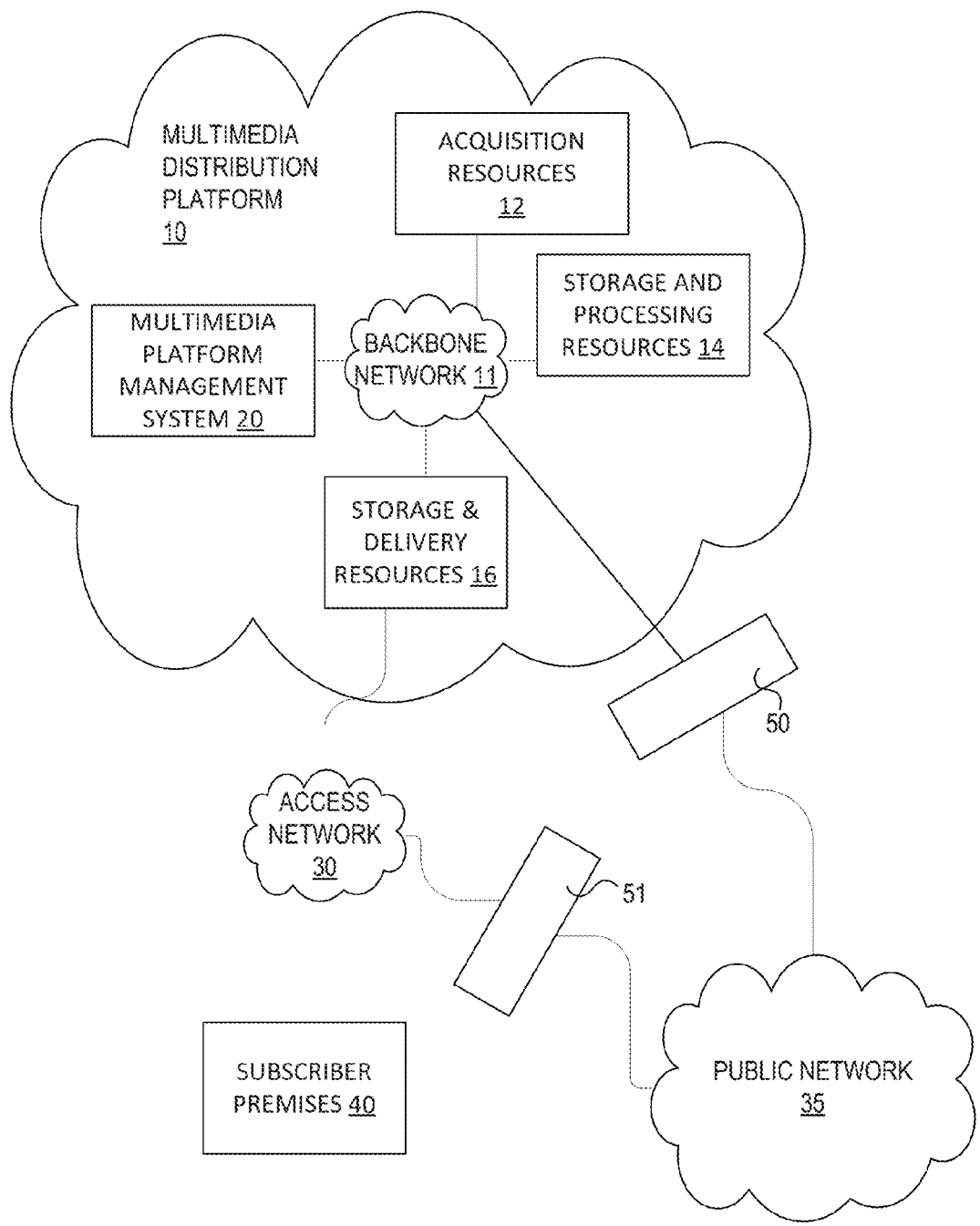
FIG. 1 illustrates a multimedia distribution platform including acquisition resources.

A dish antenna or any other type of outdoor signal acquisition device may include or interface with a de-icing system that performs or controls de-icing functions. The de-icing system may receive environmental data from environmental sensors located in close proximity to the applicable signal acquisition device. Environmental sensors may include precipitation sensors, temperature sensors, and so forth.

Outdoor signal acquisition resources may also include special purpose machines, referred to herein as shaking machines, designed and configured to perform mechanical shaking of a signal acquisition device for the purpose of preventing snow, sleet, and the like, from accumulating on the signal acquisition device. Conventionally, however, such shaking machines have lacked automated control features or relied upon information provided by the de-icing system for control. While information provided to a de-icing system may be used as a proxy for indicating when use of the shaking machines is recommended, the environmental data provided to a de-icing system may not correlate well with the existence of meteorological conditions warranting activation of the shaking machines. For example, if rain occurs and temperatures are at or near freezing, e.g., 32° F., temperature and precipitation information provided to a de-icing system may trigger operation of the shaking machines even though the shaking machines are not needed.

More generally, the environmental data provided to a de-icing system may tend to produce "false positives" with respect to the shaking machines. Operating the shaking machines when there is insufficient accumulation of snow or when the use of the shaking machines is not otherwise beneficial increases costs and accelerates wear and tear of the shaking machines. In addition, unnecessary operation of the shaking machines, which tend to generate significant noise when functioning, creates an environmental nuisance in the form of noise pollution when the shaking machines are located in populous areas.

Systems and methods disclosed herein may leverage remote management, control, and configuration functionality associated with a multimedia platform management system to enable a remotely located system manager, technician, or other user of the platform management system to enable or disable shaking machine operation. The platform management system may include platform manager software executed by a platform management server. The platform management system further includes a managed element visible to and configurable via the platform manager. In at least one embodiment, a shaking motor associated with a signal acquisition device is interfaced to a managed element of the platform management system to provide a management system user with the ability to enable and disable shaking machine operation as an element of the platform management system.

Interfacing the shaking machine to the platform management system may include connecting or otherwise providing a network managed relay that receives a control signal. The relay may be configured to couple or de-couple a power supply and the shaking machine in accordance with the control signal. In at least one embodiment, the platform management system includes resources, referred to herein as managed elements, for monitoring, configuring, and communicating with a variety of multimedia devices including signal acquisition devices. The managed elements may include hardware or other functionality to provide a network-controlled connection to a shaking machine. In at least one embodiment, the managed elements may include one or more network-managed contact closures that may be configured, for example, to provide a ground connection to a circuit that provides a control signal to a power relay. The power relay may be configured to provide power to a shaking machine in accordance with the control signal.

In at least one embodiment, the power relay, when closed, applies a local source of AC power to one or more shaking machines associated with the applicable managed element. In some embodiments, the power relay includes a solid state relay desirable for its superior resistance to moisture penetration and damage and its generally higher reliability and longer operating life. The solid state relay may include a triode for AC (triac) device.

The triac is a three terminal device in which current provided to or drawn from a gate terminal (G) enables bidirectional flow of current between a pair of output terminals referred to as the A1 and A2 terminals. In some embodiments, the triac gate terminal G is connected to an opto-isolator that receives current when the contact closure of the managed element is closed. The opto-isolator may include a light emitting diode (LED) and an optically activated AC diode (diac) in proximity to the light emitting diode. The diac may be configured to activate the triac in response to the light energy. The light energy generated by the LED may be infrared energy.

In one aspect, subject matter disclosed herein encompasses a content acquisition resource of a multimedia content delivery platform. The content acquisition resource includes a signal acquisition device, a remotely controlled power relay, and a shaking machine configured to shake the signal acquisition device. The remotely controlled power relay is configured to enable and disable operation of the shaking machine by coupling a power signal to the shaking machine in response to or otherwise in accordance with a power control signal indicative of a user input from a remotely located user. In some embodiments, the remotely controlled power relay is a solid state relay. The solid state relay may include, as an example, an opto-isolator configured to control the activation of a triac. In some embodiments, the A1 and A2 outputs of the triac connect to the hot terminal of an AC power supply and a hot terminal of the shaking machine. In some embodiments, the A1 and A2 outputs of the triac connect to the neutral terminal of the AC power supply.

Operationally, the G terminal of the triac receives an activation current, sufficient to activate the triac, in response to assertion of the power control signal. The triac is configured to establish an AC-compatible or bidirectional current path between its A1 and A2 terminals in response to the gate terminal receiving the activation current. In at least one embodiment, establishing the AC-compatible current path between the A1 and A2 terminals connects a source of AC power across supply inputs of the shaking machine and thereby provides a power signal to the shaking machine.

In at least one embodiment, the power control signal is generated in response to an input provided by a user of a platform management system. The user may interact with a user interface provided by a platform management server or by a desktop, laptop, tablet, or other computing device in communication with the platform management server. The user input may be conveyed to the managed element as a message that complies with a management protocol such as the simple network management protocol (SNMP). In one embodiment, the signal acquisition resource includes a DC power supply connected between the contact closure of the managed element and the control input of the power relay. In one embodiment, the contact closure of the managed element is configured to turn on the DC supply by connecting a ground terminal of the DC supply to a source of ground potential.

In some embodiments, the shaking machine receives environmental data signals from environmental sensors associated with a de-icing system integrated with or provided in combination with the signal acquisition device. In these embodiments, operation of the shaking machine may depend on an on/off signal generated control logic that receives the environmental data signals, but operation of the shaking machine is nevertheless subject to being overridden by the user-specified and remotely provided power control signal. In these embodiments, the control logic may achieve a degree of correlation between sensor data and environmental conditions warranting shaking machine operation while the power relay implements a user-specified and remotely provided override.

In the following description, details are set forth by way of example to facilitate discussion of the disclosed subject matter. It should be apparent to a person of ordinary skill in the field, however, that the disclosed embodiments are exemplary and not exhaustive of all possible embodiments.

Throughout this disclosure, a hyphenated form of a reference numeral refers to a specific instance of an element and the un-hyphenated form of the reference numeral refers to the element generically or collectively. Thus, for example, widget 13-1 refers to an instance of a widget class, which may be referred to collectively as widgets 13 and any one of which may be referred to generically as a widget 13.

Turning now to the drawings, FIG. 1 illustrates selected elements of a multimedia distribution platform 10 in which signal acquisition resources and techniques described herein may be practiced or included. For the sake of clarity and brevity, the selection and arrangement of the elements included in FIG. 1 omits content delivery platform detail not germane to the subject matter emphasized herein. Persons of ordinary skill will appreciate that the elements of a multimedia content delivery platform may be arranged differently and may be represented with more detail than illustrated in FIG. 1.

The multimedia distribution platform 10 illustrated in FIG. 1 includes acquisition resources 12, content storage and processing resources 14, storage and delivery resources 16, and a multimedia platform management system 20, all illustrated as interconnected by a backbone network 11. The acquisition resources 12 illustrated in FIG. 1 encompass computer hardware and supporting software, communication devices, including transmitters and receivers, and physical media for acquiring multimedia content wirelessly or via a broadband wireline network medium. Acquisition resources 12 include devices for acquiring content in any of various formats including, as non-limiting examples, analog and digital formats and compressed and uncompressed formats, and encrypted and unencrypted formats. Acquisition resources 12 may acquire local content as well as content distributed regionally or nationally. Similarly, acquisition resources 12 may acquire live content, including pay-per-view content, as well as video-on-demand and other time shifted content. A dish antenna suitable for receiving a communication satellite signal or a terrestrial broadcast signal is an example of equipment encompassed within acquisition resources 12.

Storage and processing resources 14 generally encompass servers and other equipment for performing multimedia processing including decoding of compressed content, decrypting of encrypted content, and packetizing content for distribution over an access network. Storage and processing resources 14 further encompass storage devices and systems for buffering and storing content for subsequent transmission and delivery to client premises. Storage and delivery resources 16 include servers and support devices transmitting content to a plurality of subscriber premises 40, only one of which is depicted in FIG. 1. Delivery resources 16 encompass digital delivery resources including drivers that implement a modulation format as well as a protocol stack supported by access network 30. Delivery resources 16 may, for example, include resources for multicast or unicast streaming of multimedia content to subscriber premises 40.

The multimedia platform management system 20 may support a wide variety of platform management features including features to monitor and report system status and features to manage devices and other physical elements employed in the generation, acquisition, distribution, and reception of multimedia content. The backbone network 11 illustrated in FIG. 1 may be a broadband network of optical fiber, co-axial cable, digital subscriber line (DSL) twisted copper or a combination thereof.

Access network 30 includes a physical medium or media over which content is delivered to subscriber premises 40 as well as network devices for routing signals to a plurality of end users. Access network 30 may be implemented as a private network operated by a multimedia content provider. FIG. 1 illustrates a firewall 50 segregating backbone network 11 from a public network 35 and a firewall 51 segregating access network 30 and public network 35. Access network 30 may support a multimedia friendly protocol such as a UDP/IP protocol stack.

As indicated above, acquisition resources 12 may include one or more dish antennas, which may also be referred to herein as a satellite dish. It will be appreciated that, because satellite communication generally requires line of sight between the transmitter and receiver, satellite signal receivers including dish antennas are generally positioned out of doors in an open air environment. The extent and severity of the environmental conditions to which a dish antenna or any other environmentally-exposed acquisition device may be subjected varies depending upon multiple factors including the geographic location of the environmentally exposed acquisition device. In many parts of North America and elsewhere, environmentally exposed equipment may be subject to extensive severe weather, especially during the winter months. In at least some embodiments, acquisition resources 12 of FIG. 1 include one or more environmentally exposed signal acquisition devices outfitted with one or more pieces of environmental control equipment, which may include de-icing equipment as well as one or more shaking machines for physically removing snow, sleet, hail and any other type of solid or partially solid precipitation.

Figure 2:
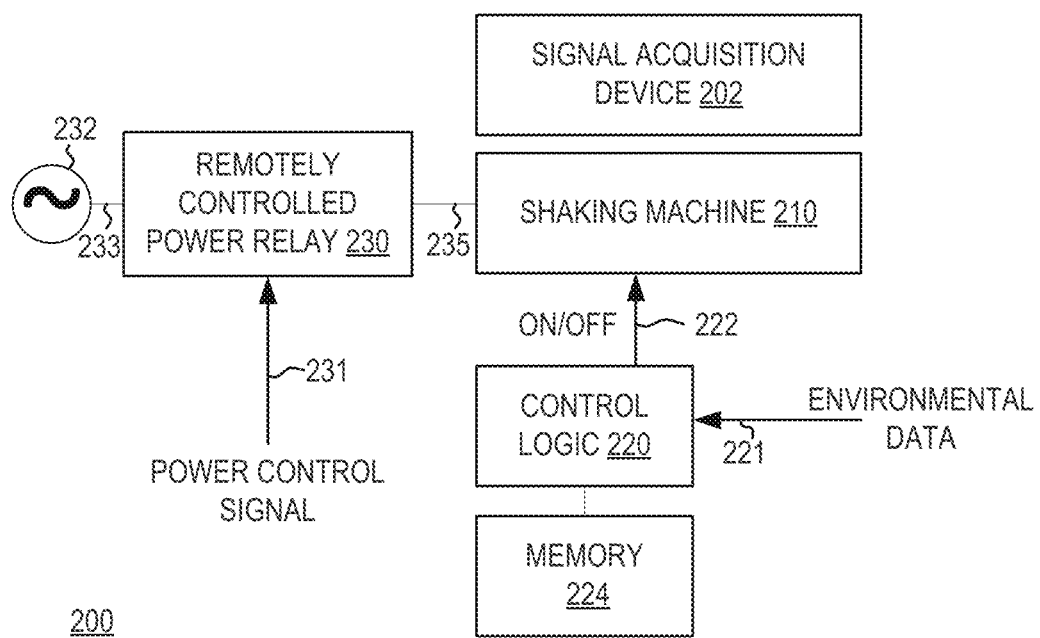
FIG. 2 illustrates a signal acquisition element suitable for use in the signal acquisition resources of FIG. 1.

FIG. 2 illustrates an example signal acquisition resource 200 configured to negate or lessen any negative effects that precipitation, cold weather, and other meteorological events and conditions may have on the signal acquisition process. The signal acquisition resource 200 illustrated in FIG. 2 includes an environmentally exposed signal acquisition device 202, a shaking machine 210, control logic 220, and a remotely controlled power relay 230. The control logic 220 illustrated in FIG. 2 receives environmental data 221, which may include weather information such as temperature and precipitation information. Control logic 220 may be implemented in any of various forms of hardware or circuit including, as non-limiting examples, field programmable logic, application specific integrated circuits, or a general purpose processor. In addition, control logic 220 may be implemented at least in part in processor executable instructions, i.e., software, stored in a computer readable memory or storage device 224. Environmental data 221 may represent information provided by one or more environmental sensors located in close proximity to signal acquisition device 202.

FIG. 2 illustrates a configuration in which power supply 232 provides power to shaking machine 210 via remotely controlled power relay 230 in accordance with power control signal 231. The signal acquisition resource 200 illustrated in FIG. 2 provides a power signal 233 generated by power supply 232 to a remotely controlled power relay 230. In at least one embodiment, remotely controlled power relay 230 is configured to couple power signal 233 to a supply input 235 of shaking machine 210. Depending upon the implementation, supply input 235 may also be connected to supply inputs (not depicted) of environmentally exposed signal acquisition device 202. In other embodiments, signal acquisition device 202 may receive power directed from power supply 232, directly from another power supply (not depicted), or via a power relay other than power relay 230. The signal provided by power supply 232 may be a conventional 120V/60 Hz signal, a 230 V/50 Hz signal, or another signal suitable for powering an electro-mechanical device.

An embodiment of the signal acquisition device 200 illustrated in FIG. 2 includes control logic 220 configured to receive environmental data 221. In some embodiments, control logic 220 is configured to control an on/off signal provided to shaking machine 210 based upon the environmental data 221. The signal acquisition resource 200 of FIG. 2, however, enables a remotely located user of platform management system 20 (FIG. 1) to override the on/off signal 222 and deactivate shaking machine 210 by deactivating power relay 230 and thereby disconnecting power signal 233 from shaking machine 210.

An example operational sequence of the signal acquisition resource 220 illustrated in FIG. 2 may initiate when control logic 220 determines, based upon environmental data 221, to activate shaking machine 210. Environmental data 221 may indicate, for example, that precipitation is occurring and that the temperature is less than or equal to a threshold value such as 32° F., although other thresholds may be employed. If, however, a system manager or other user of platform management system 20 determines that there is insufficient snow or other forms of solid or partially-solid precipitation including sleet, hail, and the like, the user may "manually" assert power control signal 231 and thereby deactivate or otherwise disable operation of shaking machine 210.

Figure 3:
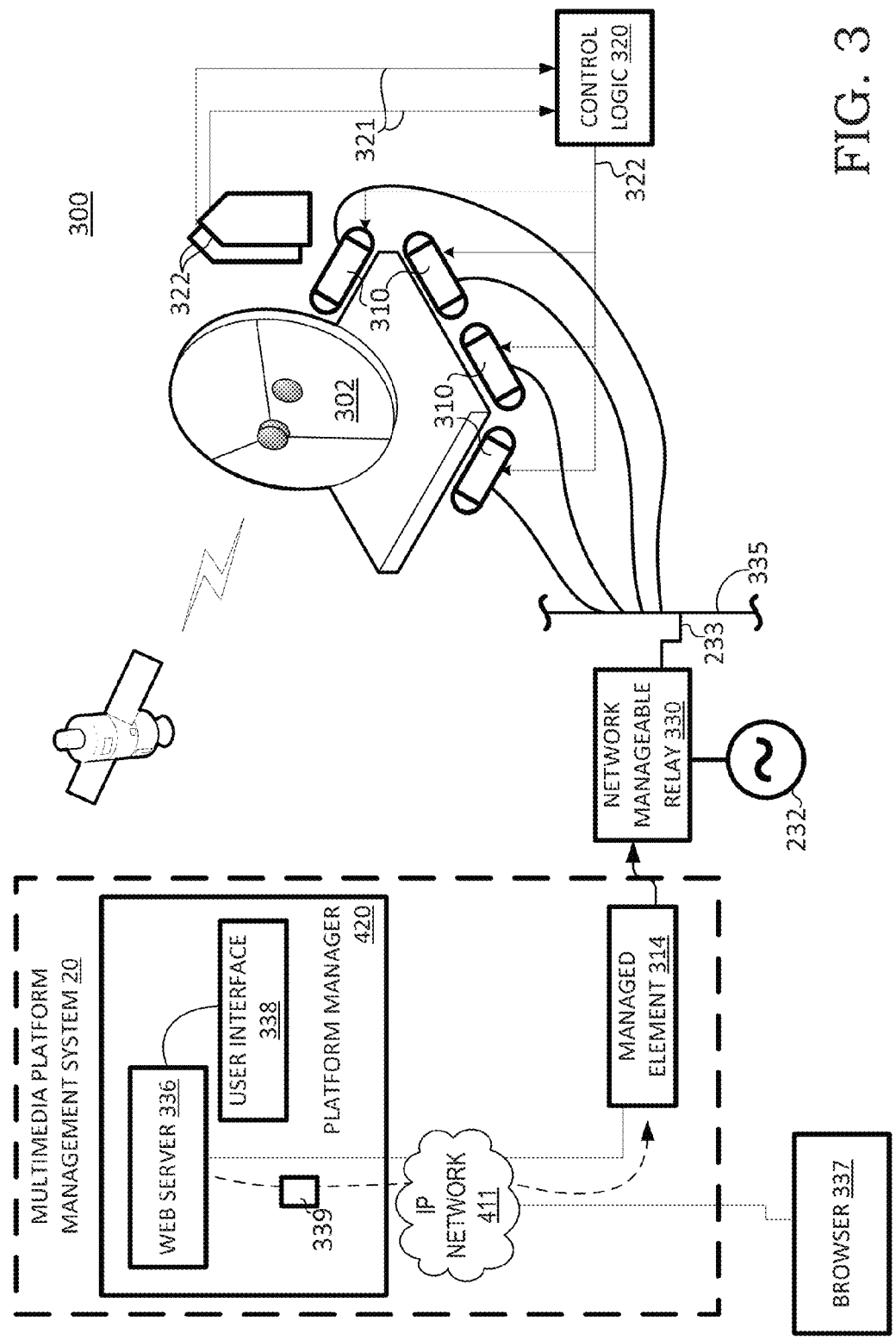
FIG. 3 illustrates a signal acquisition element including a dish antenna and a mechanical shaking machine connected to the dish antenna.

Referring now to FIG. 3, selected elements of a signal acquisition resource 300 are illustrated. Signal acquisition resource 300 may represent an example of the signal acquisition resource 200 illustrated in FIG. 2. The signal acquisition resource 300 illustrated in FIG. 3 includes a dish antenna 302, which functions as the environmentally exposed acquisition device 202 of FIG. 2, connected to shaking machine 310 and configured to be shaken when shaking machine 310 is operated. In some embodiments, acquisition device 202 may include a cover of polyethylene film or another suitable material that may be used in conjunction with a heating or de-icing system. In embodiments that include such a cover, the shaking machine 310 may directly contact and shake or vibrate the cover. Shaking machine 310 is illustrated in FIG. 3 as a plurality of electric motors. The signal acquisition resource 300 of FIG. 3 further includes control logic 320 and one or more environmental sensor(s) 322 that provide environmental or meteorological data 321 to control logic 320. Sensors 322 may include, as example, temperature sensors, humidity sensors, precipitation sensors, and so forth. Control logic 320 may be configured to determine, based at least in part on the meteorological data 321 whether there is sufficient solid or partially solid precipitation accumulating on dish antenna 302 to activate shaking machine 310 attached to various points of dish antenna 302. Shaking machine 310 may include electro-mechanical elements such as one or more electric motors, servos, and so forth, configured to produce controlled but preferably discontinuous and non-uniform movement of one or more objects affixed to or otherwise mechanically coupled to shaking machine 310. As configured in FIG. 3, shaking machine 310, when activated, produces movement of dish antenna 302.

The control logic 320 illustrated in FIG. 3 generates on/off signal 322, based at least in part on meteorological inputs 321, and provides on/off signal 322 to shaking machine 310. In some embodiments, data other than meteorological information may be employed by control logic 320 to control the on/off signal 322. For example, control logic 320 may obtain and consider time of day information, day of week information, and the like to suppress the operation of shaking machines 310 when noise generated by shaking machines 310 may be considered inappropriate or otherwise undesirable.

Signal acquisition resource 300 may further employ a network manageable relay 330 to function as a remotely controlled power relay. In some embodiments, network manageable relay 330 is an element of the platform management system 20 illustrated in FIG. 1. The network manageable relay 330 of FIG. 3 is configured to couple power supply signal 233 generated by power supply 232 to power bus 335, which is illustrated connecting to each of the shaking machines 310.

In at least some embodiments, a web server 336 of a platform manager 420 is accessible from a browser 337 or a dedicated application an IP network 411, which may include portions of backbone 11, a public network such as the Internet, and one or more firewalls to insulate the backbone network from public access. Web server 336 may serve a web page user interface 338 to browser 337. The web page user interface 338 may enable the user to activate or deactivate network manageable relay 330. Selection by the user of a button or other web page element of user interface 338 may generate a corresponding network message 339 and send message 339 to a managed element 314 of platform management system 20. The browser 337 or dedicated management application may be executed by any of various computing devices including, without limitation, a desktop or laptop computer, tablet device, or smart phone. In this manner, the network manageable relay 330 may be activated remotely from anywhere that a browser 337 or other application can gain access to backbone network 11 either directly or through a firewall via the Internet or another public network.

Signal acquisition resource 300 beneficially enables a multimedia platform provider to manually override control logic 320 to prevent unwanted operation of shaking machines 310. For example, control logic 320 may lack adequate complexity to determine reliably when there is sufficient snow, sleet, or another other form of cold weather precipitation to warrant the use of shaking motors 310. Heavy snow may be characterized by different combinations and values of environmental parameters, making it desirable to implement a manual control feature such as the network manageable relay 330. Moreover, the environmental conditions generally associated with the use of shaking motors 310 make it potentially difficult and challenging to override control logic 320 by accessing a physically manipulated relay or breaker located between power supply 232 and shaking machine 310.

Figure 4:
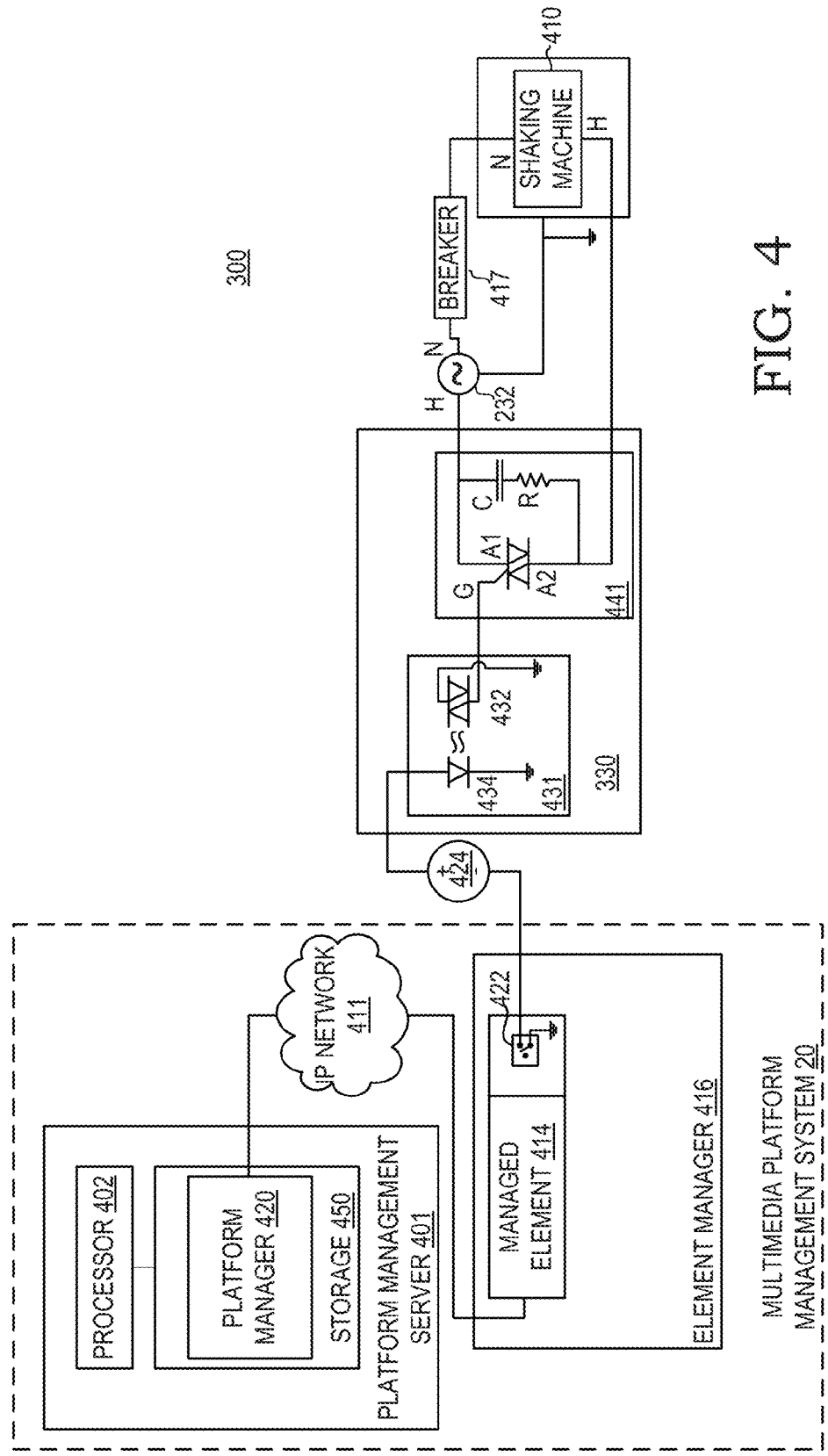
FIG. 4 illustrates a shaking motor interfaced to a multimedia platform management system.

FIG. 4 depicts additional detail of an example signal acquisition resource 300 in which network manageable relay 330 is a solid state relay that includes a triac 441 and an opto-isolator 431. The network manageable relay 330 illustrated in FIG. 4 is connected between a contact closure 422 of a managed element 414 within an element manager 416 and a "hot" terminal H of power supply 232, through an intervening power supply 424, which may be a DC voltage source of 9V or another suitable value. A neutral input N of power supply 232 is connected to a first end of a conventional circuit breaker 417 and a second end of circuit breaker 417 is connected to a neutral terminal N of a supply input for shaking machine 410. A hot terminal H of the supply input for shaking motor 410 is connected to an A2 terminal of triac 441 while the A1 terminal of triac 441 is connected to the hot terminal H of power supply 232 to complete the power circuit for shaking motor 410.

The opto-isolator 431 illustrated in FIG. 4 includes an LED 434 in proximity to an optically activated diac 432. The opto-isolator 431 illustrated in FIG. 4 receives a signal from a power supply 424, which may be a DC power supply generating a 9 V signal or a DC voltage of a different magnitude, an AC voltage signal, or a different type of signal.

A negative terminal of the voltage source 424 is illustrated in FIG. 4 connected to a contact of a contact closure 422. The contact closure 424 of FIG. 4 comprises one of potentially multiple elements controlled by an element manager 414. Element manager 414 may include functionality enabling the platform operation to configure, monitor, and manage devices and other physical elements of a multimedia platform. The element manager 414 is shown in FIG. 4 in communication with a platform manager 420 via backbone network 11. The platform manager 420 illustrated in FIG. 4 includes executable program instructions stored in a computer readable medium such as storage 450 of a platform management server 401 and executed by a processor 402 of platform management server 401. Platform management system 20 may include features of a commercially distributed multimedia platform application such as the ROSA Network Management System from Cisco. Similarly, the element manager 414 may include features of a ROSA Element Manger from Cisco.

To the maximum extent allowed by law, the scope of the present disclosure is to be determined by the broadest permissible interpretation of the following claims and their equivalents, and shall not be restricted or limited to the specific embodiments described in the foregoing detailed description.

What is claimed is:

1. A content acquisition resource in a multimedia content delivery platform, the content acquisition resource comprising:
    a shaking machine configured to shake an environmentally exposed signal acquisition device; and
    a remotely controlled power relay configured to couple a power signal to the shaking machine responsive to assertion of a power control signal indicative of a user input from a remotely located user.

2. The content acquisition resource of claim 1, wherein the remotely controlled power relay comprises a solid state relay.

3. The content acquisition resource of claim 2, wherein the solid state relay comprises:
    a triac including:
    a gate terminal configured to receive an activation current responsive to assertion of the power control signal; and
    first and second output terminals configured to establish an AC-compatible current path responsive to the gate terminal receiving the activation current.

4. The content acquisition resource of claim 3, wherein the solid state relay further includes:
    an opto-isolator including:
    a light emitting diode (LED) configured to generate light energy responsive to receiving the power control signal; and
    an optically activated AC diode (diac) in proximity to the light emitting diode, configured to provide the activation current to the triac in response to receiving light energy from the LED.

5. The content acquisition resource of claim 1, wherein the power control signal comprises an output of a DC power supply, wherein a ground terminal of the DC supply is connected to a contact closure of a managed element of a platform management system.

6. The content acquisition resource of claim 1, wherein the signal acquisition device comprise a dish antenna.

7. A platform management system for a multimedia delivery platform, the system comprising:
- a platform manager configured to monitor status of multimedia delivery platform resources including signal acquisition resources;
- a managed element, accessible via the platform manager, including an externally accessible contact closure controllable via input from a user of the platform manager; and
- a solid state relay including a control terminal coupled to the contact closure of the manager element and output terminals configured to output a power signal responsive to the control terminal receiving an activation current.

8. The platform management system of claim 7, further comprising a shaking device configured to shake a signal acquisition device, wherein supply inputs of the shaking device are connected to the solid state relay output terminals.

9. The platform management system of claim 8, further comprising a direct current (DC) power supply coupled between the contact closure and the control terminal of the solid state relay, wherein the contact closure is configured to provide a ground potential to a ground terminal of the DC power supply responsive to the user input.

10. The platform management system of claim 9, wherein the solid state relay includes an opto-isolator and wherein the DC power supply is configured to provide a DC current to the opto-isolator responsive to the user input.

11. The platform management system of claim 10, further comprising a web server configured to provide a user interface to a browser associated with the user for providing the user input.

12. A multimedia delivery platform comprising:
- a platform manager configured to monitor status of platform resources including content acquisition resources;
- a managed element visible to the platform manager, including an externally accessible contact closure wherein a state of the contact closure is specified by user input provided by a platform manager user;
- a shaking device configured to shake a signal acquisition device; and
- a power relay including a control terminal coupled to the contact closure of the managed element, wherein output terminals of the power relay deliver power to a shaking device responsive to activation of the power relay.

13. The multimedia delivery platform of claim 12, further comprising the signal acquisition device.

14. The multimedia delivery platform of claim 13, wherein the signal acquisition device comprises a dish antenna.

15. The multimedia delivery platform of claim 13, further comprising control logic configured to assert an on/off signal for the signal acquisition device in accordance with meteorological information received via environmental sensors, wherein the shaking machine is configured to shake the signal acquisition device when the on/off signal is asserted and the power relay is activated.

16. The multimedia delivery platform of claim 15, wherein the meteorological information includes temperature information received from a temperature sensor and precipitation information received from a precipitation sensor.

17. The multimedia delivery platform of claim 16, wherein the control logic is configured assert the on/off signal in further accordance with time-date information including information selected from: time of day information, day of week information, and day of year information.

18. The multimedia delivery platform of claim 12, further comprising a DC power circuit configured to provide a DC current to the power relay control terminal responsive to closure of the contact closure.

19. The multimedia delivery platform of claim 12, wherein the power relay comprises a solid state relay including an opto-isolator configured to activate a triac responsive to assertion of the contact closure and wherein the triac is configured to couple a power signal to the shaking machine responsive to activation of the triac by the opto-isolator.

20. The multimedia delivery platform of claim 12, further comprising:
- a processor; and
- a computer readable storage device, wherein the platform manager includes processor executable program instructions, executable by the multimedia delivery platform.

* * * * *